United States Patent [19]

Eberhard

[11] Patent Number: 4,556,848

[45] Date of Patent: Dec. 3, 1985

[54] POINT SENSITIVE NMR IMAGING SYSTEM USING A MAGNETIC FIELD CONFIGURATION WITH A SPATIAL MINIMUM

[75] Inventor: Philippe H. Eberhard, El Cerrito, Calif.

[73] Assignee: The United States of America as represented by the United States Department of Energy, Washington, D.C.

[21] Appl. No.: 462,816

[22] Filed: Feb. 1, 1983

[51] Int. Cl.$^4$ ............................................ G01R 33/08
[52] U.S. Cl. ..................................... 324/309; 324/307
[58] Field of Search ............... 324/300, 307, 309, 319, 324/320

[56] References Cited

U.S. PATENT DOCUMENTS

| | | | |
|---|---|---|---|
| 3,932,805 | 1/1976 | Abe | 324/309 |
| 4,015,196 | 3/1977 | Moore et al. | 324/309 |
| 4,021,726 | 5/1977 | Garroway | 324/309 |
| 4,070,611 | 1/1978 | Ernst | 324/309 |
| 4,115,730 | 9/1978 | Mansfield | 324/309 |
| 4,315,216 | 2/1982 | Clow | 324/309 |
| 4,322,684 | 3/1982 | Hounsfield | 324/309 |

OTHER PUBLICATIONS

Damadian et al., "NMR in Cancer: XVI Fonar Image of the Live Human Body," Physiol. Chem. & Phys., 9, pp. 97–100, (1977).

Bornell et al., "Positron Tomography and Nuclear Magnetic Resonance Imaging", Science vol. 215, pp. 619–626, Feb. 5, 1982.

I. A. Pykett, "NMR Imaging in Medicine", pp. 78–88, Scientific Amer., May 1982.

Primary Examiner—Michael J. Tokar
Attorney, Agent, or Firm—Clifton E. Clouse, Jr; Roger S. Gaither; Judson R. Hightower

[57] ABSTRACT

A point-sensitive NMR imaging system (10) in which a main solenoid coil (11) produces a relatively strong and substantially uniform magnetic field and a pair of perturbing coils (PZ1 and PZ2) powered by current in the same direction superimposes a pair of relatively weak perturbing fields on the main field to produce a resultant point of minimum field strength at a desired location in a direction along the Z-axis. Two other pairs of perturbing coils (PX1, PX2; PY1, PY2) superimpose relatively weak field gradients on the main field in directions along the X- and Y-axes to locate the minimum field point at a desired location in a plane normal to the Z-axes. An RF generator (22) irradiates a tissue specimen in the field with radio frequency energy so that desired nuclei in a small volume at the point of minimum field strength will resonate.

10 Claims, 1 Drawing Figure

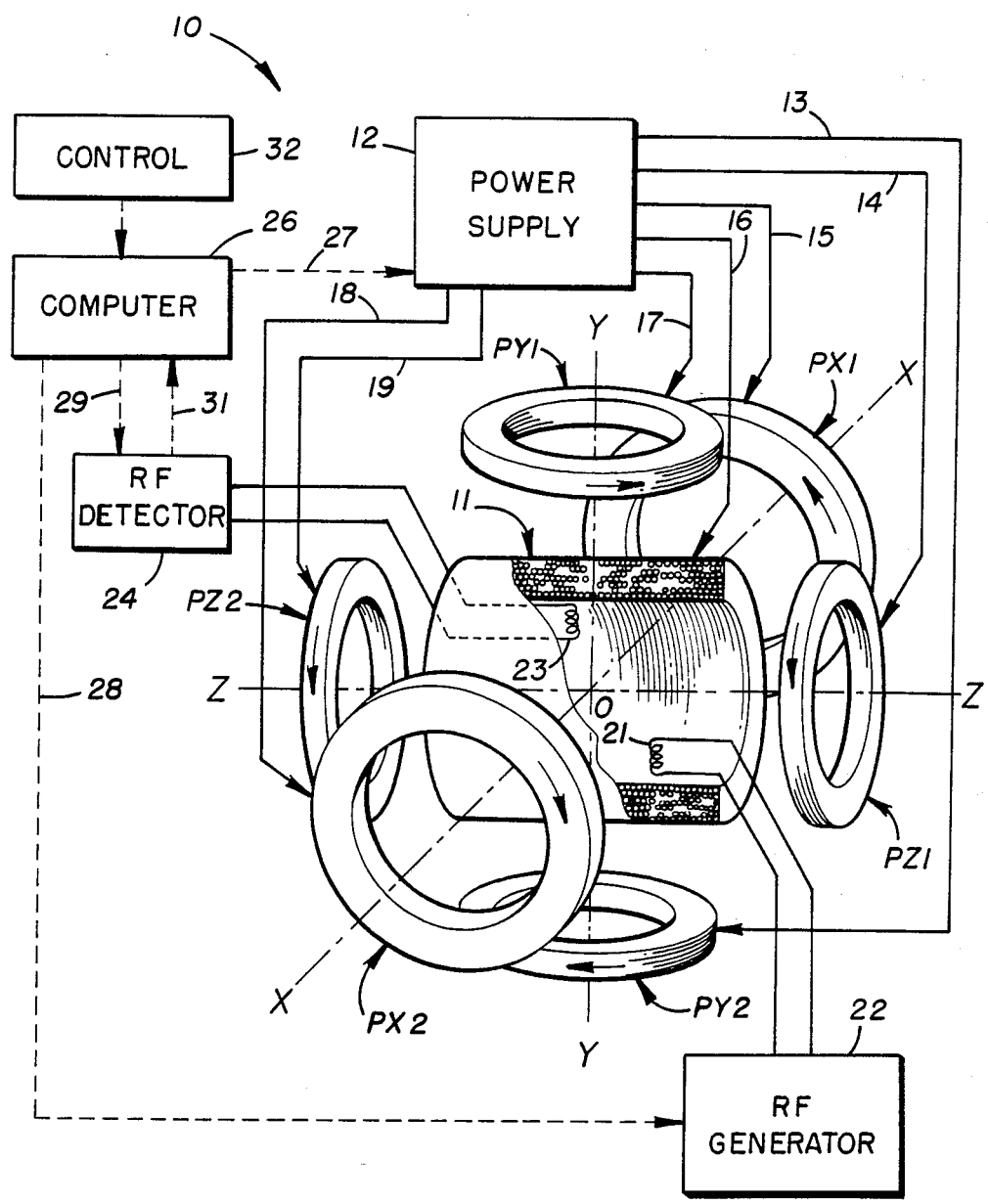

POINT SENSITIVE NMR IMAGING SYSTEM USING A MAGNETIC FIELD CONFIGURATION WITH A SPATIAL MINIMUM

The United States Government has rights in this invention pursuant to Contract No. W-7405-ENG-48 between the U.S. Department of Energy and the University of California.

BACKGROUND OF THE INVENTION

The present invention relates generally to nuclear magnetic resonance imaging systems and more particularly with the manner in which information is obtained from a localized point of interest in a specimen.

Nuclear magnetic resonance (NMR) imaging has had significant success as a non-invasive medical diagnostic tool, in that cross-sectional pictures through the human body can be obtained without exposing the patient to the risk of physiological harm attendant with the use of X-rays. Further, NMR imaging enables considerably more information to be obtained as to tissue state in internal organs, as compared to X-rays. For example, changes in the NMR relaxation time parameters $T_1$ and $T_2$, from point to point in a specimen can be used to discriminate between healthy and diseased tissue.

The basic principle of NMR can be appreciated by considering, for example, hydrogen nuclei associated with water in a tissue specimen. Such nuclei have an angular momentum arising from their inherent property of rotation, or spin. Since nuclei are electrically charged, the spin corresponds to a current flowing about the spin axis, which in turn generates a small magnetic field. Each nucleus has a magnetic moment, a dipole, associated with it. In the absence of an external magnetic field, the magnetic dipoles of the spinning nuclei will point in random directions.

When a static magnetic field is applied, the nuclei tend to align themselves with the field's lines of force, either with or against the field. The two orientations have slightly different energies, and the net difference between the upper and lower energy states will make the magnetization vector precess around a direction parallel to the applied magnetic field, in a manner analogous to a spinning top which precesses, or wobbles, under the influence of a gravitational field. This direction conventionally defines the Z axis.

If electromagnetic energy is now applied to the specimen at a frequency which matches the natural precessional frequency of the specimen, energy will be absorbed by the nuclei, causing the precessing bulk vector to tip further away from the Z axis. In turn, the increased tipping of the precessing bulk vector which results from the nuclear magnetic resources will increase the electromagnetic radiation from the nuclei at its resonant frequency, and such radiation can be detected by a receiver tuned to that frequency. The detected signal will have a magnitude proportional to the number of resonant nuclei in the tissue specimen.

A simple mathematical relationship links the resonance, or precession, frequency to the magnitude of the externally applied static magnetic field. The resonance frequency is equal to the strength of the field multiplied by the gyromagnetic ratio, which is unique for each nuclear species of nonzero spin. For hydrogen nuclei (protons) in a magnetic field of one tesla (10,000 gauss), the resonance frequency is 42.57 megahertz (MHz). For nuclei of the isotope phosphorous 31 in the same field, the resonance frequency is 17.24 MHz; for nuclei of sodium 23 it is 11.26 MHz. These frequencies are in the radiofrequency band of the electromagnetic spectrum. Such frequencies, far below those of X-rays or even visible light, have no known adverse effects on molecules of living systems.

In use as a diagnostic tool, information as to the nuclear concentration and relaxation parameters at many different points throughout a specimen are needed so that an image can be created for visual observation and study. The resolution of the image will depend, of course, on the number of discrete points in the specimen for which discrete information as to the nuclei concentration is obtained.

Conventionally the specimen is placed in a strong magnetic field and perturbing coils are used to create field gradients so that the field strength at a single plane through the specimen will have the same value throughout that plane. In principle, the specimen is irradiated with radio frequency energy of the proper frequency so that all of the nuclei of interest at that plane will resonate and produce a signal proportional to the total number of nuclei of that signal plane and dependent on their relaxation parameters. By a change of the currents in the perturbing coils, the signal plane is rotated about an axis and translated in space to obtain additional information about the nuclei in the different positions of the signal plane. Some systems use different frequencies to measure different planes simultaneously. Information as to each plane position and total nuclei concentration for that plane position are entered into a computer. After a full scan, the computer will solve the large number of simultaneous equations so that the nuclei characteristics at the points of intersection of the signal planes can be ascertained so that two dimensional images can then be created showing the nuclei characteristics at all the points in a desired plane through the specimen, or so that three dimensional images can be created on a cathode ray tube.

NMR imaging has been a successful and accurate method of measuring some tissue characteristics and thereby diagnosing the location of tumors, organ and irregularities in research animals and humans.

However, there are drawbacks to conventional NMR imaging systems. Good spatial resolution requires large amounts of scanning time, which is limited by the difficulty of immobilizing the patient or region to be scanned. This limitation is due in part to the time required to collect numerous configurations of one-dimensional signals that are needed to successfully map the region of interest. Since conventional tomographic methods portray density distributions on slices through a three dimensional specimen, this information is given in one or two dimensions. As a consequence powerful computers are needed to make the complex calculations that construct the region in three dimensions. If less powerful computers are used, a great deal of computer time is needed. Further, the conventional imaging systems are not as useful for imaging a rapidly fluctuating tissue, such as a pulsating heart, because of the movement of the tissue during the length of time required for a full scan.

Attempts have been made to obtain three-dimensional data directly, but very complicated modulations of the magnetic field, and/or of the frequency of the applied radio frequency energy, are required to determine the characteristics of resonating nuclei per unit volume at a single discrete point where spatial location

3 is ascertainable. These systems are complex because localization of the region in interest depends on how the signal evolves in time. Further, these systems provide only a limited spatial resolution.

SUMMARY OF THE INVENTION

It is an object of the invention to provide an NMR imaging system utilizing a point-sensitive method which collects information on nuclear parameters in real time from three-dimensional raw data, thereby avoiding some of the above-mentioned disadvantages of existing NMR systems.

It is a further object of the invention to provide an NMR imaging system enabling magnetic permeability of a tissue specimen, in addition to the other parameters, to be investigated.

A further object of the invention is the provision of an NMR imaging system and method wherein the magnetic field has a minimum value at a single locatable point in the specimen and wherein nuclear magnetic resonance occurs only in a small volume at that point. This point is important if the most complete information has to be collected over a limited volume in space.

Additional objects, advantages and novel features of the invention will be set forth in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects and in accordance with the present invention, as embodied and broadly described herein, an NMR imaging system is provided, such system having means for applying a relatively strong magnetic field to a specimen along an axis, means for applying a first pair of relatively weak perturbing fields to said specimen along a first axis parallel to the applied strong magnetic field and with both perturbing fields being in the same direction, means for applying second and third pairs of relatively weak perturbing fields to said specimen, said fields of said second pair being in opposite direction, said fields of said third pair being in opposite directions, said second and third pairs of fields being on axes orthogonal to each other and to the axis of the first pair of fields, means for irradiating the specimen with high frequency energy at the resonant frequency of desired nuclei at the point of minimum field strength and means for detecting nuclei in the specimen resonating at said resonating frequency.

It is also preferred that the relatively strong field be generated by a main coil, and that pairs of perturbing coils be used for generating the perturbing fields, all of the coils having axes meeting at a point generally centrally of the main coil.

BRIEF DESCRIPTION OF THE DRAWING

The accompanying drawing, which is incorporated in and forms a part of the specification, illustrates an embodiment of the present invention and together with the description serves to explain the principles of the invention.

The single FIGURE of the drawing is a perspective view of the magnetic coils and a block diagram of the components of a point-sensitive NMR imaging system in accordance with the present invention.

DETAILED DESCRIPTION OF THE INVENTION

Referring now to the drawing, which illustrates a preferred embodiment of the invention, the point-sensitive NMR imaging system 10 includes a main solenoid coil 11. When energized, the coil 11 will produce a relatively strong, homogeneous magnetic field along its axis, the coil being large enough to contain a specimen of interest, i.e. one with magnetically resonant nuclei, within the substantially uniform field usually located near its center. If the system is to be used for in vivo examination of an adult human, the main coil 11 may have a diameter in the order of one meter.

As illustrated in the drawing, the system 10 has X-, Y- and Z- orthogonally coordinate axes, with the Z-axis being coincident or closely parallel to the axis of main coil 11, and with the origin O of the axes being at or near the center of the main coil.

The system 10 further includes three pairs of perturbing coils, with perturbing coils PX1 and PX2 centered on the X-axis, perturbing coils PY1 and PY2 centered on the Y-axis, and perturbing coils PZ1 and PZ2 centered on the Z-axis. Preferably the perturbing coils are all located equidistantly from the origin O, and each has a diameter greater than its distance from the origin.

A power supply 12 provides electrical current to the solenoid 11 and the six perturbing coils through supply lines 13, 14, 15, 16, 17, 18 and 19, as shown in the drawing. The X-axis perturbing coils PX1 and PX2 are powered with current in opposite direction, as are the Y-axis perturbing coils PY1 and PY2. The two perturbing coils PZ1 and PZ2 along the Z axis are powered with current in the same direction. The intensities of the perturbing fields produced by the perturbing coils are relatively weak, in comparison with the relatively strong magnetic field produced by the main solenoid coil 11. Accordingly, the relative field quality for the perturbing coils can be less than for the solenoid coil. For example, in a system wherein the field produced by the main coil 11 has an intensity on the order of 2 tesla, the intensity of the perturbing fields in the X- and Y- directions can be on the order of 0.27 tesla and the intensity of the perturbing fields along the Z-axis can be on the order of $1.2 \times 10^{-2}$ tesla (120 Gauss).

With the system as thus far described, a magnetic field will be generated in the main coil 11, the field having a configuration with a minimum value at a particular point or location in the interior of the main coil 11.

Energization of the perturbing coils PZ1 and PZ2 with current flowing in the same direction will produce a pair of relatively weak perturbing magnetic fields which are spaced apart along the Z-axis and in the same direction. These perturbing fields are superimposed on the main magnetic field generated by the main coil and the resultant field will have a minimum value along the Z-axis at some point in space between the two coils PZ1 and PZ2, with the field intensity increasing in both directions in the Z-direction from that point. If the coils PZ1 and PZ2 have the same number of turns and are powered by the same amount of current, then the minimum field point will be half-way between the two coils.

Energization of the two perturbing coils PX1 and PX2 with current in opposite direction will generate a gradient magnetic field in a direction along the X-axis which is superimposed on the main magnetic field to locate the point of minimum field intensity in the X- direction within the main solenoid 11. Likewise, energization of the two perturbing coils PY1 and PY2 with current in opposite direction will generate a gradient magnetic field along the Z-axis to locate the point of minimum field intensity in the Y-direction within the main solenoid.

The value of the field intensity at the minimum point can be calculated from the currents in the main solenoid coil and the six perturbing coils. Assuming that a specimen has been placed in the main solenoid and the point of minimum field strength is within the specimen, an observation can now be made as to the magnetically resonant nuclei in a small volume in the specimen at that particular point. To do this, the RF generator 22 is tuned so that the RF coil 21 disposed within the main coil 11 and in proximity to this specimen will irradiate the specimen with energy of a frequency equal to the resonant frequency of the nuclei located at the point of minimum field strength. The resonant frequency for the desired nuclei is dependent on the value of field strength. Consequently, with a field configuration having a point of minimum value, resonance can be made to occur in a small volume at that point only.

Nuclear magnetic resonance can now be detected by pickup coil 23 located within the main coil 11, the pickup coil 23 being connected to RF detector 24 which is tuned to the resonant frequency, i.e. to the frequency of the RF generator 22. The signal detected by the RF detector 24 will have a magnitude dependent on the number of nuclei in the small volume of the specimen at the point of minimum field value.

By moving the minimum field point to different spatial locations and by ascertaining the magnitude of resonance and duration of signals at each point, data can be obtained as to nuclei characteristics at the various points within a desired three-dimensional region.

Relocation of the minimum point in a Z-direction is achieved by running slightly different currents in each of the perturbing coils PZ1 and PZ2. Similarly, the location of the minimum can be changed in the X-direction by slightly unbalancing the currents in the PX1 and PX2 perturbing coils. Likewise, the location of the minimum can be changed in the Y-direction by slightly unbalancing the currents in the PY1 and PY2 perturbing coils.

After relocation of the minimum point has been achieved with the perturbing coils, the current in main solenoid 11 can be changed to adjust the field strength at the minimum point so that the nuclei thereat will resonate at a desired frequency. Alternatively, after relocation of the minimum point, the RF generator 22 and RF detector 24 can be adjusted to the resonant frequency of the nuclei of interest as determined by the strength of the field at its minimum point.

Relocation of the minimum field point in a specimen can also be achieved by mechanical movement of the perturbing coils, or by change of position of the specimen. Such movement will provide a more direct spatial control. However, spatial location of the minimum field point in the specimen with such physical movement (which must be correlated with the collected data as to the nuclei characteristics at each location) is much slower than obtaining the spatial location data by an adjustment of electrical current in the perturbing coils.

The size of the volume of the specimen at the point of minimum field strength in which nuclear magnetic resonance will occur is dependent on the band width of the resonance, and on the magnitude of the second derivatives of the field strength at the minimum point in all three dimensions. The volume of resonance can be varied for a given field strength of the main coil 11 by changing the currents in the pairs of perturbing coils by the same amount and with the same sign.

Since the coils are independently powered, the system has an adjustable "focus" with the dimension of the resonant volume being adjustable in the X-, Y- and Z-directions so that the resonant volume can have a spherical or ellipsoidal shape of desired dimension.

Obtainable resolution of the NMR imaging system will depend on the overall volume of the specimen and the length of time available for observing a particular point of interest. In the system, the detected signal will be due to the resonance of the nuclei in the small volume amount at the point of minimum field strength and to the background noise in the remainder of the specimen. For example, if the specimen volume is in the order of 1 liter and the desired resonant volume at the point of minimum field is in the order of 100 mm$^3$, to provide an adequate spatial resolution in three dimensions, the ratio of the total specimen volume to the resonant volume is in the order of $10^4/1$. Even though the resonant signal is much stronger then the background signal per unit of volume, the total amount of background signal will provide a limit to the degree to which the resonant volume may be reduced in size.

The degree of resolution is also dependent upon the amount of time that a particular point of interest is examined. If a sufficient number of measurements of signal intensity are taken at a particular point, the random background components of the received signal will average out so that a more accurate determination of the resonant signal component may be made.

The off-resonance background signal is virtually unaffected by small variations in the frequency of the RF generator 22 or in the main solenoid coil current. On the other hand, the resonant frequency signal of the nuclei at the minimum point has the characteristic that it will be present when the specimen is being irradiated with radio frequency energy at the resonant frequency of the nuclei at the point of minimum field strength. As the value of field intensity is raised at that point, resonance will suddenly cease. The same is true if the minimum field strength is maintained constant and the frequency of the RF generator is reduced below the resonant frequency of the nuclei at the point of minimum field strength.

The accompanying drawing shows the remainder of the NMR imaging system 10. In particular the system 10 includes a computer 26 which is connected by control lines 27, 28 and 29 to the power supply 12, the RF generator 22 and RF detector 24. The system is initially calibrated by energizing the main solenoid 11 and by supplying currents of calculated amounts to the perturbing coils so that the minimum field point is positioned at all of the various points in a three-dimensional volume at which resonance data are to be obtained. For each of these points, data is entered into the computer to indicate the magnitude of the currents in the perturbing coils. A small test specimen of water is moved to each of the points of minimum field strength, and the current level in the main coil 11 is varied to produce resonance of the nuclei in the test specimen at the frequency of the RF generator 22. Data is entered in to the computer as to the magnitude of the main solenoid coil current for nuclear resonance at each of the selected points of interest.

After calibration, the computer will have, for each desired point of interest, data as the amount of current in the perturbing coils to locate the minimum field point at the desired point and data as to the amount of main solenoid current necessary to produce nuclear magnetic resonance at that point for a given frequency of the RF generator 22.

The control 32 is used to instruct the computer 26 to investigate one or more of the calibrated points of interest. A single point of interest can be investigated repeatedly, or a scan may be made of selected points of interest in a small volume of a specimen or in a limited area in a single plane through a specimen, or whatever is desired. For each selected point of interest, the stored data in the computer is used to cause the power supply 12 to set the levels of current in the perturbing coils to locate the minimum field point at the desired location in a specimen, and to set the level of current in the main solenoid coil to produce nuclear magnetic resonance at this location.

For each point of interest, the RF detector 24 will detect resonance and a signal proportional to the magnitude of the resonance at that point will be fed to the computer through input line 31. The computer will then store three-dimensional scan data, i.e., discrete resonant signal information for each of the points investigated in a three-dimensional volume. The control 32 will also enable selected scan data in computer 26 to be displayed on conventional imaging equipment (not shown).

Alternatively, the imaging system 10 can be calibrated by placing the test specimen at each point of interest, with the RF generator being tuned to produce resonance in the tissue specimen at the minimum value of the magnetic field thereat. Data as to the resonant frequency of the RF generator is entered into the computer for each point of interest. In use, the computer will then cause the RF generator 22 and RF detector 24 to be tuned to the frequency necessary to cause nuclear resonance at the value of the field strength at its minimum point.

The disclosed NMR imaging system is quite advantageous in that NMR can be excited in a small volume only in a large specimen, thus enabling the system to focus on one region of interest, saving considerable time if the object of interest is reasonably localized. Further, variations of the magnetic field in time are not required for localization of the point in space and, therefore, measurement of NMR time characteristics is easier. Measurement of magnetic permeability of a tissue specimen is accessible.

The foregoing description of a preferred embodiment has been presented for purposes of illustration and description. It is not intended to be exhaustive or to limit the invention to the precise form disclosed, and obviously many modifications and variations are possible in light of the above teaching. For example, it is well known that superconducting magnetic coils and solenoids are particularly useful in NMR application and can be employed in the present invention. The embodiment was chosen and described in order to best explain the principles of the invention and its practical application to thereby enable others in the art to best utilize the invention in various embodiments and with various modifications as are suited to the particular use contemplated. Although the above description is directed to medical diagnostic use, NMR imaging has applications in the detection of various organic molecules of interest, and its value is by no means limited to the medical field.

It is intended that the scope of the invention be defined by the claims appended hereto.

I claim:

1. The method of investigating a specimen having magnetically resonant nuclei comprising:
    (a) providing a relatively strong magnetic and substantially uniform field with no variations in time and having a direction along an axis passing said specimen,
    (b) superimposing a first of relatively weak perturbing magnetic fields with no variations in time on said relatively strong magnetic field, said perturbing fields being spaced apart along said axis and in the same direction along said axis to establish a point of minimum magnetic field strength at a location between said perturbing fields and within said specimen,
    (c) irradiating said specimen with high frequency radiation of a frequency of the magnetic resonance of said nuclei at said location of minimum fields strength,
    (d) detecting signal information resulting from the magnetic resonance of said nuclei, and
    (e) applying a second pair of relatively weak perturbing magnetic fields to said specimen, said fields of said second pair being spaced apart and oppositely directed and centered on a second axis orthogonal to said first axis, and
    (f) applying a third pair of relatively weak perturbing magnetic fields to said specimen, said fields of said third pair being spaced apart and oppositely directed and centered on a third axis which is orthogonal to both said first and second axes, said second and third pairs of magnetic fields having no variations in time.

2. The method according to claim 1 and further including:
    repeatedly varying the relative strength of the perturbing fields to shift the point of minimum magnetic field strength in a direction along said axis and to different locations between said perturbing fields and within said specimen,
    irradiating said specimen with high frequency energy of a frequency of the magnetic resonance of said nuclei at said different locations,
    detecting signal information resulting from the magnetic resonance of said nuclei at said different locations.

3. The method according to claim 1 and further including:
    repeatedly varying the relative strength of the first pair of perturbing fields to shift the point of minimum magnetic field strength in a direction along said axis to different locations between said perturbing fields and within said specimen,
    repeatedly varying the gradient of said second and third pair of magnetic fields to shift the point of minimum magnetic field strength to different locations radially of said axis,
    irradiating said specimen with high frequency energy of a frequency of magnetic resonance of said nuclei at said location,
    detecting signal information resulting from the magnetic resonance of said nuclei at said different locations.

4. The method according to claim 3 wherein the frequency of said high frequency energy is maintained constant and the strength of said relatively strong magnetic field is varied to cause magnetic resonance of said nuclei at said different locations.

5. The method according to claim 3 wherein the strength of said relatively strong magnetic field is maintained constant and the frequency of said high frequency energy is varied to cause magnetic resonance of said nuclei at said different locations.

6. Apparatus for investigating a specimen having magnetically resonant nuclei, said apparatus comprising:

means for applying a relatively strong and substantially uniform magnetic field with no variations in time to said specimen, means for applying a first pair of relatively weak perturbing magnetic fields with no variations in time to said specimen, said pair of perturbing fields being spaced apart and centered on an axis parallel with the strong magnetic field through said specimen, said pair of fields being in the same direction and acting with said strong magnetic field to create a point of minimum field strength located in said specimen, means for irradiating said specimen with high frequency energy at the resonant frequency of said nuclei which are at said point of minimum field strength, means for detecting nuclei in said specimen which are resonating at said resonant frequency, means for applying a second pair of relatively weak perturbing magnetic fields to said specimen, said fields of said second pair being spaced apart and oppositely directed and centered on a second axis orthogonal to said first axis, and means for applying a third pair of relatively weak perturbing magnetic fields to said specimen, said fields of said third pair being spaced apart and oppositely directed and centered on a third axis which is orthogonal to both said first and second axes, said second and third pairs of magnetic fields having no variations in time.

7. Apparatus according to claim 6 wherein said means for applying a first pair of perturbing fields has the further function of varying the relative strengths of the first pair of perturbing fields to cause said point of minimum field strength to shift to a second location.

8. Apparatus according to claim 7 wherein said means for applying a relatively strong magnetic field includes an electrically energizable main coil adapted to encircle said specimen with the axis of said main coil passing through said specimen, and wherein said means for applying a first pair of perturbing fields includes a pair of perturbing coils each coaxial with said main coil and also includes means for applying electrical current to said perturbing coils to flow through said coils in the same direction.

9. Apparatus according to claim 6, wherein said means for applying a pair of perturbing fields centered on the axis of said relatively strong magnetic field has the further function of varying the relative strengths of the two fields of said pair, wherein said means for applying a second pair of perturbing fields has the further function of varying the relative strengths of the two fields of said second pair, and wherein said means for applying a third pair of perturbing fields has the further function of varying the relative strengths of the two fields of said third pair, said varying of said perturbing fields causing said point of minimum field strength in said specimen to shift to a second location for investigation.

10. Apparatus according to claim 6, wherein said means for applying a relatively strong magnetic field includes an electrically energizable main coil adapted to encircle said specimen with the axis of said main coil passing through said specimen, wherein said means for applying a first pair of perturbing fields includes a pair of spaced-apart perturbing coils each coaxial with said main coil and also includes means for applying electrical current to said perturbing coils to flow through said coils in the same direction, wherein said means for applying a second pair of perturbing fields includes a second pair of spaced apart coaxial perturbing coils, with the axis of said second pair of perturbing coils passing through said axis of said main coil, and also includes means for applying electrical current to said second pair of coils to flow through said coils in opposite directions, and wherein said means for applying a third pair of perturbing fields includes a third pair of spaced apart perturbing coils, with the axis of said third pair of perturbing coils passing through the axes of said main coil and said second pair of perturbing coils, and also includes means for applying electrical current to said third pair of coils to flow through said coils in opposite directions.

* * * * *